United States Patent
Lin et al.

(10) Patent No.: US 7,599,220 B2
(45) Date of Patent: Oct. 6, 2009

(54) CHARGE TRAPPING MEMORY AND ACCESSING METHOD THEREOF

(75) Inventors: Yung-Feng Lin, Taoyuan (TW); Chun-Hsiung Hung, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 308 days.

(21) Appl. No.: 11/802,785

(22) Filed: May 25, 2007

(65) Prior Publication Data

US 2008/0291722 A1    Nov. 27, 2008

(51) Int. Cl.
 *G11C 16/06* (2006.01)
(52) U.S. Cl. .............................. 365/185.2; 365/185.21; 365/189.09; 365/210.1; 365/210.11; 365/210.12
(58) Field of Classification Search .............. 365/185.2, 365/185.21, 189.011, 189.09, 210.1, 210.11, 365/210.02
See application file for complete search history.

(56) References Cited

U.S. PATENT DOCUMENTS

| | | | |
|---|---|---|---|
| 7,123,514 B2* | 10/2006 | Watanabe | 365/185.21 |
| 7,440,330 B2* | 10/2008 | Noichi | 365/185.2 |
| 7,495,955 B2* | 2/2009 | Ido | 365/185.02 |

* cited by examiner

*Primary Examiner*—VanThu Nguyen
(74) *Attorney, Agent, or Firm*—Bacon & Thomas, PLLC

(57) ABSTRACT

An accessing method for a charge trapping memory including memory cells and tracking cells for storing expected data. The method includes the following steps. In a specific time first, the expected data is written into the tracking cells and the memory cells are not being programmed, read or erased. Next, the data stored in the tracking cells is sensed as read data according to a present reference current. Then, the present reference current is adjusted to an adjusted reference current according to a difference between the read data and the expected data so that the data stored in tracking cells is sensed as corresponding with the expected data according to the adjusted reference current. Thereafter, the memory cells are read according to the adjusted reference current.

19 Claims, 4 Drawing Sheets

CHARGE TRAPPING MEMORY AND ACCESSING METHOD THEREOF

BACKGROUND OF THE INVENTION

1. Field of the Invention

The invention relates in general to a charge trapping memory and an accessing method thereof, and more particularly to a charge trapping memory and an accessing method capable of ensuring reading reliability.

2. Description of the Related Art

Electrically erasable and programmable non-volatile memories are used in various applications, and a charge trapping memory based on a charge trapping dielectric layer is one of the electrically erasable and programmable non-volatile memories. The charge trapping dielectric layer such as a silicon nitride layer is utilized to trap charges and store data. When negative charges are being trapped, the threshold voltage of the memory cell increases. The threshold voltage of the memory cell is reduced when the negative charges are removed from the charge trapping dielectric layer. However, the threshold voltage of the memory cell is decreased and an operation window is shifted due to the charge loss after multiple times of cycling or data retention. Consequently, the unreliability will occur when the memory cell is read again.

The conventional solution is to utilize a cycling table for storing the operation condition of the memory cell, and then the memory cell is read according to this cycling table so as to ensure the reliability of reading the memory cell. However, this cycling table cannot solve the problem caused by the charge loss after the data retention. In addition, it is a quite complicated work to define the cycling table according to different numbers of cycling.

In addition to the above-mentioned solution, the prior art also utilizes extra bits to calculate the numbers of "1" and "0" in the read data and compare the numbers of "1" and "0" in the read data with those in the previously written data. If the numbers are different from each other, the value of the reference current is adjusted, and then the memory cell is read again until the numbers are the same. However, if the memory is a charge trapping memory, the method mentioned hereinabove cannot be applied to the charge trapping memory due to the requirement of the high-speed operation.

SUMMARY OF THE INVENTION

The invention is directed to a charge trapping memory and an accessing method thereof, in which a reference current is adjusted in a specific time to correctly read memory cells so as to solve the problem of an operation window shift of the memory cells caused by the charge loss after multiple times of cycling or data retention.

According to a first aspect of the present invention, a charge trapping memory is provided. The charge trapping memory comprises multiple memory cell blocks, a reference current generator, multiple sense amplifiers and multiple comparators. Each memory cell block includes memory cells and tracking cells for storing expected data. The reference current generator outputs a present reference current. In a specific time, the sense amplifiers sense the data stored in the tracking cells as read data according to the present reference current. Then, the comparators compare the read data with the expected data to obtain a difference. The reference current generator adjusts the present reference current to an adjusted reference current according to the difference so that the sense amplifiers again sense the data stored in the tracking cells as the expected data. Then, the sense amplifiers read the memory cells according to the adjusted reference current.

According to a second aspect of the present invention, a method of accessing a charge trapping memory is provided. The charge trapping memory includes memory cells and tracking cells for storing expected data. The method includes the following steps. First, the data stored in the tracking cells is sensed as read data according to a present reference current in a specific time, wherein the memory cells are not being programmed, read or erased in the specific time. Then, the present reference current is adjusted to an adjusted reference current according to a difference between the read data and the expected data so that the data stored in the tracking cells is sensed as the expected data according to the adjusted reference current. Thereafter, the memory cells are read according to the adjusted reference current.

The invention will become apparent from the following detailed description of the preferred but non-limiting embodiments. The following description is made with reference to the accompanying drawings.

DETAILED DESCRIPTION OF THE INVENTION

Figure 1:
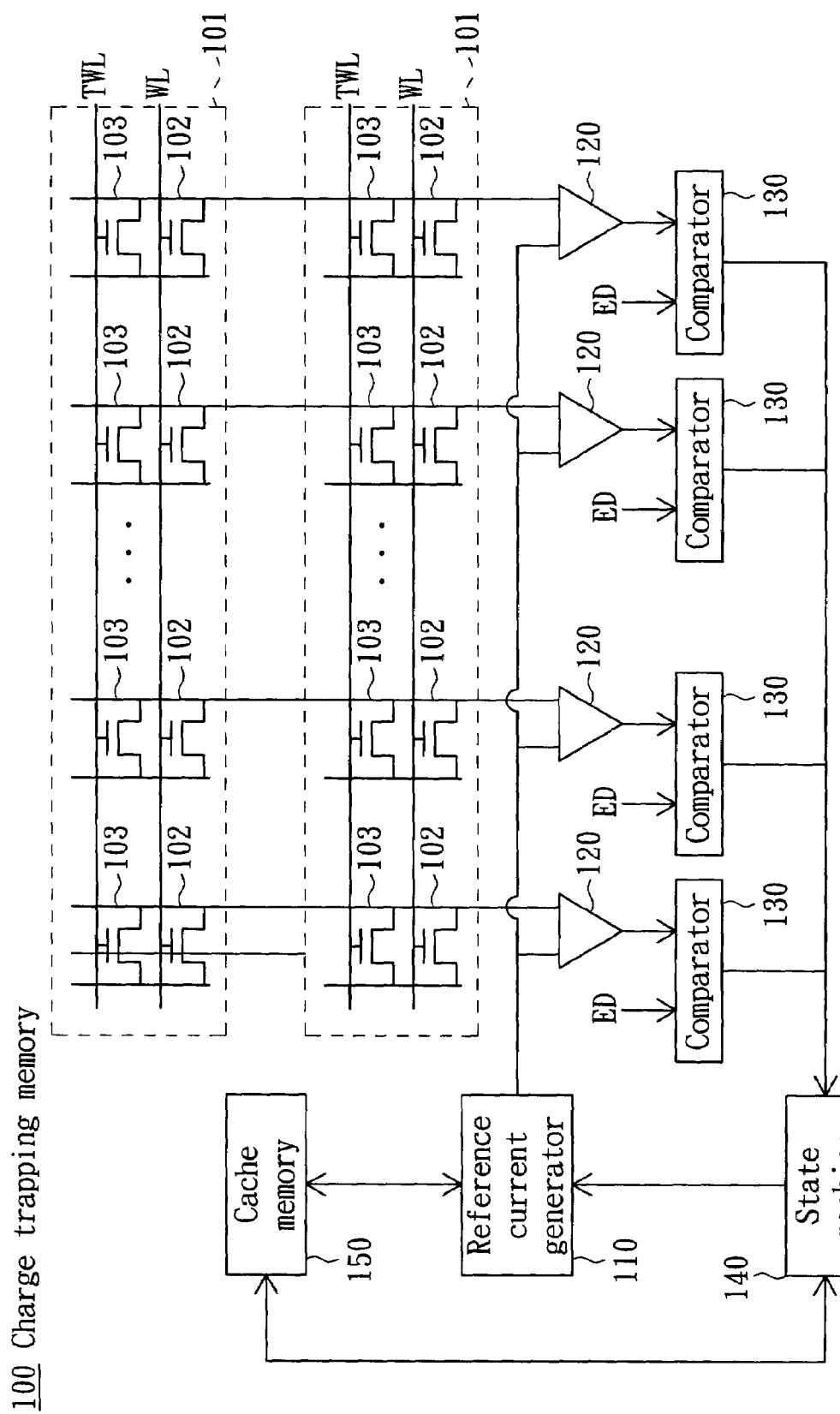
FIG. 1 shows a structure of a charge trapping memory according to a preferred embodiment of the invention.

FIG. 1 shows a structure of a charge trapping memory 100 according to a preferred embodiment of the invention. Referring to FIG. 1, the charge trapping memory 100, such as a NOR type charge trapping memory, includes multiple memory cell blocks 101, a reference current generator 110, multiple sense amplifiers 120, multiple comparators 130, a state machine 140 and a cache memory 150. Each memory cell block 101 includes multiple memory cells 102 and multiple tracking cells 103. Each column of memory cells 102 corresponds to one word line WL, and the multiple tracking cells 103 correspond to a tracking word line TWL.

The tracking cells 103 store expected data ED, which includes 32 sets of "0" and "1", if the number of tracking cells 103 is 64, for example. The expected data ED is written into the tracking cells 103 in a wafer sort time period before the charge trapping memory 100 is shipped out. Or after the charge trapping memory 100 performs an erasing or programming operation, the expected data ED is written into the multiple tracking cells 103 again.

The reference current generator 110 is a digital/analog reference current generator for generating a present reference current $I_{ref}$. In a specific time, the sense amplifiers 120 sense the data stored in the tracking cells 103 as read data according to the present reference current $I_{ref}$. This specific time is a time period from a time instant, at which the NOR type charge trapping memory 100 receives a power reset signal, to a time instant, at which the NOR type charge trapping memory 100 reaches an operation voltage, a time period after the NOR type charge trapping memory 100 is in an idle state, or a time period after the NOR type charge trapping memory 100 performs an erasing or programming operation.

At this time, the multiple memory cells 102 and the multiple tracking cells 103 may be programmed, read or erased together before the specific time. Then, the comparators 130 compare the read data sensed from the tracking cells 103 with the expected data ED to obtain a difference therebetween. The state machine 140 is coupled to the comparators 130 and the reference current generator 110. The state machine 140 outputs a corresponding digital-to-analog code to the reference current generator 110 according to this difference.

Because the reference current generator 110 is a digital/analog generator, it adjusts the present reference current $I_{ref}$ to an adjusted reference current $I_{ref}'$ according to the digital-to-analog code so that the sense amplifiers 120 again sense the data stored in the tracking cells 103 as corresponding with the expected data ED according to the adjusted reference current $I_{ref}'$. Thus, it represents that this adjusted reference current compensates for the problem of the operation window shift caused by the charge loss. Then, the sense amplifiers 120 read the memory cells 102 according to the adjusted reference current $I_{ref}'$. Because the adjusted reference current $I_{ref}'$ has compensated for the problem of the operation window shift caused by the charge loss, the reading of the memory cells 102 has the reliability.

The cache memory 150 is coupled to the state machine 140 and the reference current generator 110. The cache memory 150 has a look-up table for recording the difference and the corresponding adjusted reference current, which is substantially the corresponding digital-to-analog code. When the state machine 140 receives the difference in the specific time, the state machine 140 enables the cache memory 150 to output the corresponding adjusted reference current, which is substantially the corresponding digital-to-analog code, to the reference current generator 110 according to the look-up table. Then, the reference current generator 110 can immediately adjust the present reference current $I_{ref}$ to the adjusted reference current $I_{ref}'$ without the slow adjustment and does not have to linearly adjust the present reference current to the adjusted reference current so that a lot of time is saved.

Figure 2:
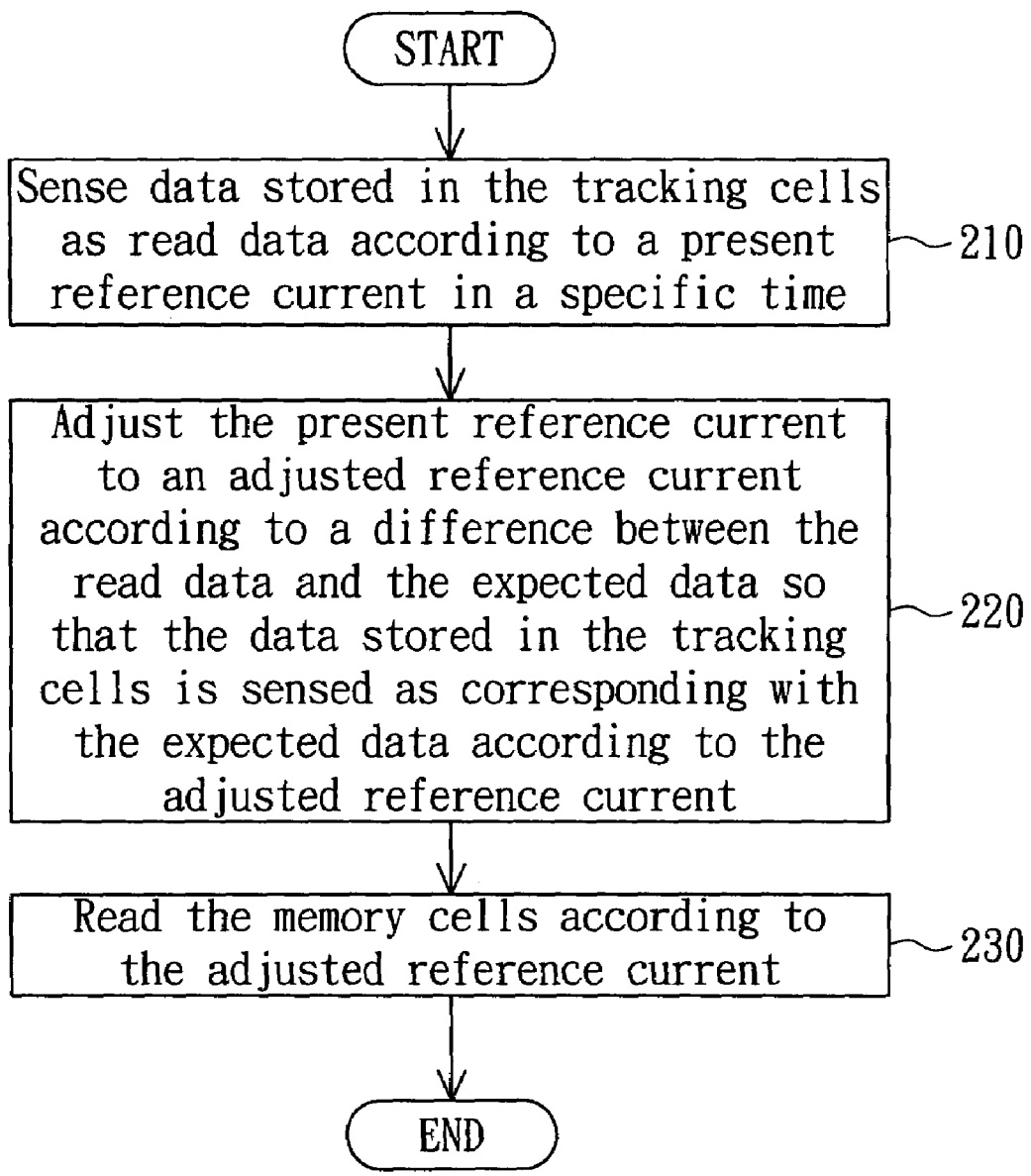
FIG. 2 is a flow chart showing a method of accessing the charge trapping memory according to the preferred embodiment of the invention.

FIG. 2 is a flow chart showing a method of accessing the charge trapping memory according to the preferred embodiment of the invention. The charge trapping memory includes multiple memory cells and multiple tracking cells for storing expected data in a wafer sort time period before the charge trapping memory is shipped out. In addition, the expected data will be written into the multiple tracking cells again after the charge trapping memory performs an erasing or programming operation. The expected data includes 32 sets of "0" and "1" if the number of the tracking cells is 64, for example. The tracking cells are programmed, read or erased together with the memory cells.

First, in step 210, the expected data is written into the tracking cells after the charge trapping memory 100 performs an erasing or programming operation in which the memory cells are not being programmed, read or erased. Then, in step 210, the data stored in the tracking cells is sensed as read data according to a present reference current. Because the memory cells and the tracking cells may be programmed, read or erased together before the specific time, the tracking cells may have the charge loss, thereby causing the sensed read data to be not correspond with the expected data. That is, if the memory cells are sensed according to the present reference current, no reliability can be obtained.

Next, in step 220, the present reference current is adjusted to an adjusted reference current according to a difference between the read data and the expected data so that the data stored in the tracking cells is sensed as corresponding with the expected data according to the adjusted reference current. The difference between the read data and the expected data represents that the tracking cells have the charge loss, so the memory cells encountering the same operations may also have the charge loss. If the memory cells are read according to the present reference current, the read error may occur. So, the present reference current is adjusted to the adjusted reference current according to the difference between the read data and the expected data. Consequently, it represents that the adjusted reference current compensates for the problem of the operation window shift caused by the charge loss.

Thereafter, in step 230, the memory cells are read according to the adjusted reference current. Because the adjusted reference current has compensated for the problem of the operation window shift caused by the charge loss, the reading of the memory cells has the reliability. In addition, the adjustment of the adjusted reference current is substantially a linear analog adjustment. In order to increase the adjusting speed, the difference between the read data and the expected data and the adjusted reference current corresponding to the difference may be recorded in a look-up table. Consequently, when the difference is obtained by comparing the read data with the expected data, it is possible to obtain the corresponding adjusted reference current from the look-up table, and then to read the memory cells according to the adjusted reference current. Thus, a lot of time is saved because it is unnecessary to adjust the present reference current to the adjusted reference current linearly.

Figure 3:
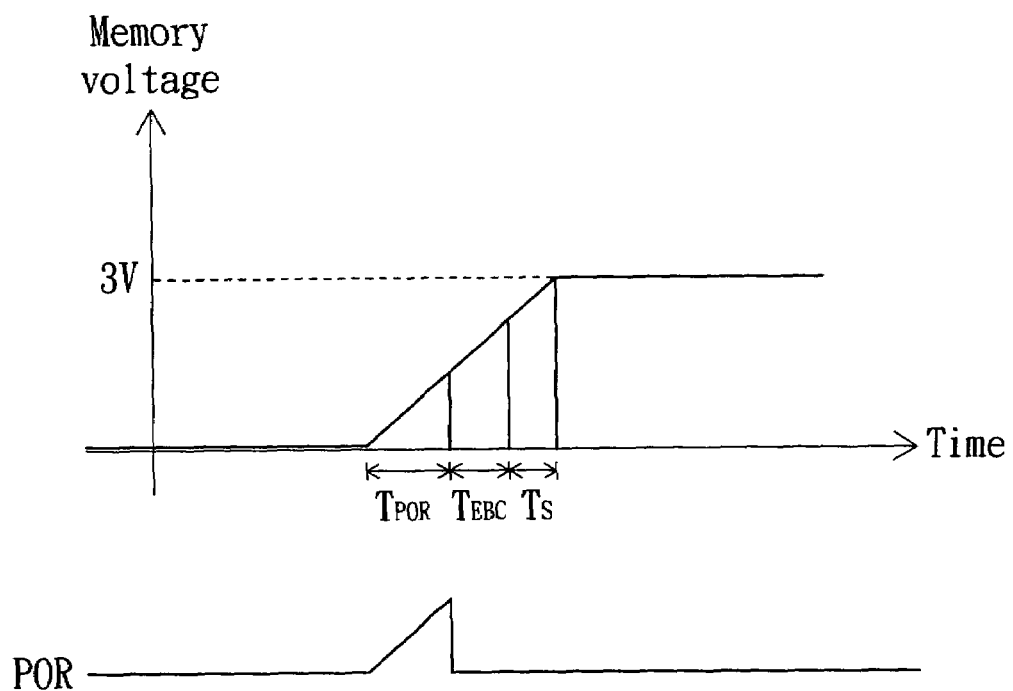
FIG. 3 is a schematic illustration showing an example at a specific time according to the preferred embodiment of the invention.

In addition, because the accessing method of the embodiment is applied to the charge trapping memory having the requirement of the high speed operation, no longer latency occurs. Thus, the specific time in step 210 may be a time period from a time instant, at which the charge trapping memory receives a power reset signal, to the time instant, at which the charge trapping memory reaches an operation voltage. FIG. 3 is a schematic illustration showing an example at the specific time according to the preferred embodiment of the invention. As shown in FIG. 3, after the charge trapping memory receives the power reset signal POR, the memory voltage starts to rise in a time period $T_{POR}$. In a time period $T_{EBC}$, the charge trapping memory performs the operation of error bit check. Then, the following time period $T_s$ is the specific time in this embodiment.

Figure 4:
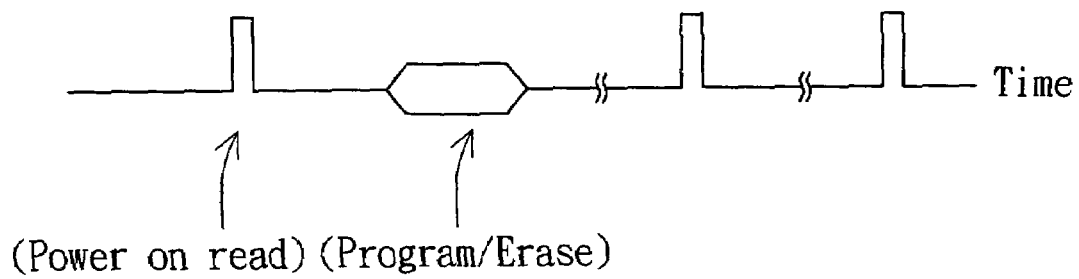
FIG. 4 is a schematic illustration showing another example at the specific time according to the preferred embodiment of the invention.

In addition, the specific time in step 210 may also be a time period after the charge trapping memory is in an idle state. FIG. 4 is a schematic illustration showing another example at the specific time according to the preferred embodiment of the invention. As shown in FIG. 4, after the charge trapping memory has performed the operation such as reading, programming or erasing, the charge trapping memory stops and is in the idle state (i.e., the idle time $T_{Idle}$, which may be a default value), and the following time period $T_s$ is the specific time in this embodiment. Consequently, the accessing method according to the embodiment of the invention may also ensure the data reading correctness after the data retention. In addition, the specific time may also be a time period after the charge trapping memory performs the programming or erasing operation and before the charge trapping memory performs the next operation.

Figure 5:
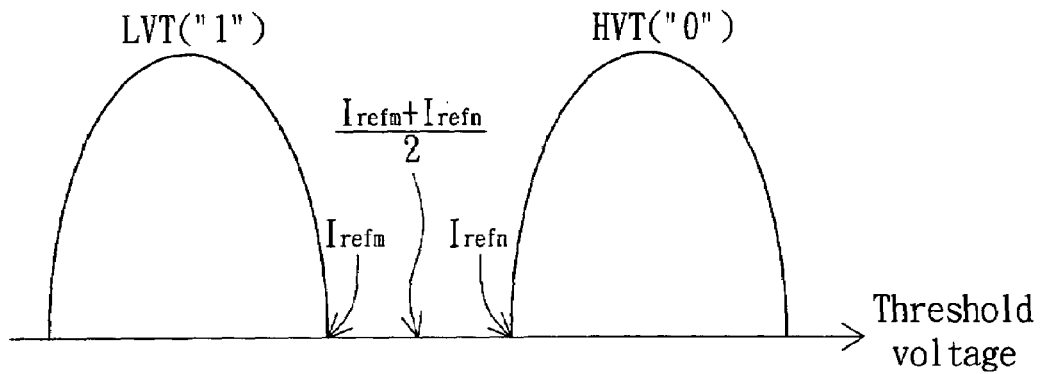
FIG. 5 shows the distributions of a threshold voltage of tracking cells according to the preferred embodiment of the invention.

The step 220 for adjusting the present reference current to the adjusted reference current according to the difference between the read data and the expected data may be implemented in several ways. FIG. 5 shows the distributions of a threshold voltage of the tracking cells according to the preferred embodiment of the invention. As shown in FIG. 5, the high threshold voltage distribution HVT represents "0", and the low threshold voltage distribution LVT represents "1". First, the value of the present reference current is adjusted until the number of "1" of the read data is different from the number of "1" of the expected data. At this time, the present reference current is $I_{refm}$, which is defined as a first reference current. The value of the present reference current is adjusted until the number of "0" of the read data is different from the number of "0" of the expected data. At this time, the present reference current is $I_{refn}$, which is defined as a second reference current. Then, the first reference current $I_{refm}$ and the second reference current $I_{refn}$ are averaged so that $(I_{refm}+I_{refn})/2$ is the adjusted reference current. Thereafter, the difference and the corresponding adjusted reference current $(I_{refm}+I_{refn})/2$ are recorded in the look-up table.

Figure 6:
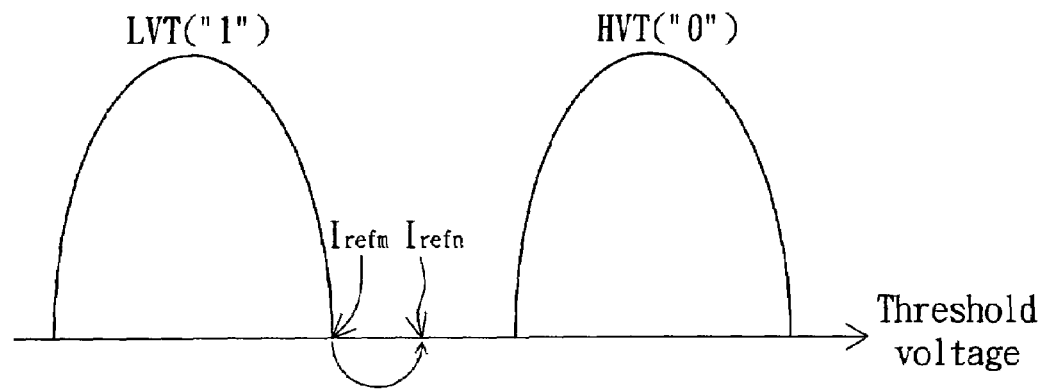
FIG. 6 shows the distributions of another threshold voltage of the tracking cells according to the preferred embodiment of the invention.

FIG. 6 shows the distributions of anther threshold voltage of the tracking cells according to the preferred embodiment of the invention. As shown in FIG. 6, the high threshold voltage distribution HVT represents "0" and the low threshold voltage distribution LVT represents "1". First, the value of the present reference current is adjusted until the number of "1" of the read data is different from the number of "1" of the expected data. At this time, the present reference current is $I_{refm}$, which is defined as a first reference current. Then, a reference current $I_{refn}$ greater than the first reference current $I_{refm}$ is defined as the adjusted reference current. The reference current $I_{refn}$ makes the memory cells have the sufficient operation window. Thereafter, the difference and the corresponding adjusted reference current $I_{refn}$ are recorded in the look-up table.

Figure 7:
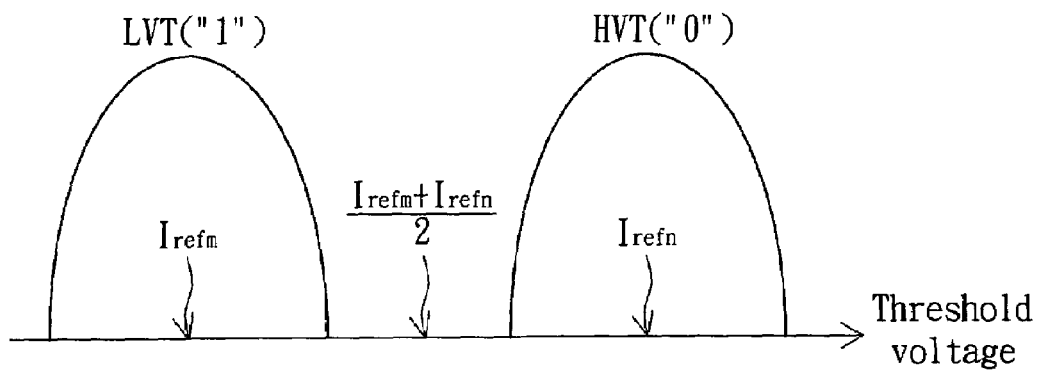
FIG. 7 shows the distributions of still anther threshold voltage of the tracking cells according to the preferred embodiment of the invention.

FIG. 7 shows the distributions of still anther threshold voltage of the tracking cells according to the preferred embodiment of the invention. As shown in FIG. 7, the high threshold voltage distribution HVT represents "0" and the low threshold voltage distribution LVT represents "1". First, the value of the present reference current is adjusted until the number of "1" of the read data is one half of the number of "1" of the expected data. At this time, the present reference current is $I_{refm}$, which is defined as a first reference current. Then, the value of the present reference current is adjusted until the number of "0" of the read data is one half of the number of "0" of the expected data. At this time, the present reference current is $I_{refn}$, which is defined as a second reference current. Then, the first reference current $I_{refm}$ and the second reference current $I_{refn}$ are averaged so that $(I_{refm}+I_{refn})/2$ is the adjusted reference current. Thereafter, the difference and the corresponding adjusted reference current $(I_{refm}+I_{refn})/2$ are recorded in the look-up table.

In the charge trapping memory and the accessing method thereof according to the embodiment of the invention, the multiple tracking cells are disposed in each memory cell block, the present reference current is adjusted to the adjusted reference current according to the difference between the read data and the expected data in the specific time, and then the memory cells may be read correctly according to the adjusted reference current. Thus, it is possible to solve the problem of the operation window shift of the memory cells caused by the charge loss after multiple times of cycling or data retention. Consequently, the reliability of reading the memory cells may be enhanced.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A charge trapping memory, comprising:
    a plurality of memory cell blocks each comprising a plurality of memory cells and a plurality of tracking cells for storing expected data;
    a reference current generator for outputting a present reference current;
    a plurality of sense amplifiers; and
    a plurality of comparators, wherein:
    in a specific time, the sense amplifiers sense the data stored in the tracking cells as read data according to the present reference current, then the comparators compare the read data with the expected data to obtain a difference, the reference current generator adjusts the present reference current to an adjusted reference current according to the difference so that the sense amplifiers sense the data stored in the tracking cells as the expected data, and then the sense amplifiers read the memory cells according to the adjusted reference current.

2. The memory according to claim 1, wherein the expected data is stored in the tracking cells in a wafer sort time period or written into the tracking cells again after the charge trapping memory performs an erasing or programming operation, and the tracking cells are programmed, read or erased together with the memory cells.

3. The memory according to claim 1, wherein the reference current generator is a digital/analog reference current generator.

4. The memory according to claim 3, further comprising.
    a state machine, which is coupled to the comparators and the reference current generator, for the digital/analog reference current generator adjusting the present reference current to the adjusted reference current according to the difference.

5. The memory according to claim 4, further comprising:
    a cache memory, which is coupled to the state machine and the reference current generator and has a look-up table for recording the difference and the adjusted reference current corresponding to the difference;
    wherein in the specific time, the state machine outputs the difference to the cache memory, which enables the reference current generator to output the adjusted reference current according to the look-up table.

6. The memory according to claim 1, wherein the specific time is a time period from a time instant, at which the charge trapping memory receives a power reset signal, to another time instant, at which the charge trapping memory reaches an operation voltage.

7. The memory according to claim 1, wherein the specific time is a time period after the charge trapping memory is in an idle state.

8. The memory according to claim 1, wherein the specific time is a time period after the charge trapping memory is programmed or erased.

9. A method of accessing a charge trapping memory, which comprises a plurality of memory cells and a plurality of tracking cells for storing expected data, the method comprising the steps of:

sensing the data stored in the tracking cells as read data according to a present reference current in a specific time, in which the memory cells are not being programmed, read or erased;

adjusting the present reference current to an adjusted reference current according to a difference between the read data and the expected data so that the data stored in the tracking cells is sensed as the expected data according to the adjusted reference current; and reading the memory cells according to the adjusted reference current.

10. The method according to claim 9, wherein the expected data is stored in the tracking cells in a wafer sort time period.

11. The method according to claim 9, wherein the tracking cells are programmed, read or erased together with the memory cells.

12. The method according to claim 9, wherein the difference and the adjusted reference current are recorded in a look-up table.

13. The method according to claim 12, further comprising the steps of:

comparing the read data with the expected data to obtain the difference;

obtaining the adjusted reference current from the look-up table according to the difference; and reading the memory cells according to the adjusted reference current.

14. The method according to claim 9, wherein the specific time is a time period from a time instant, at which the charge trapping memory receives a power reset signal, to another time instant, at which the charge trapping memory reaches an operation voltage.

15. The method according to claim 9, wherein the specific time is a time period after the charge trapping memory is in an idle state.

16. The method according to claim 9, wherein the specific time is a time period after the charge trapping memory performs a programming or erasing operation.

17. The method according to claim 12, wherein the step of adjusting the present reference current to the adjusted reference current according to the difference between the read data and the expected data comprises:

adjusting a value of the present reference current, defining the present reference current as a first reference current when the number of "1" of the read data is different from the number of "1" of the expected data, and defining the present reference current as a second reference current when the number of "0" of the read data is different from the number of "0" of the expected data;

averaging the first reference current and the second reference current to get the adjusted reference current; and recording the difference and the adjusted reference current in the look-up table.

18. The method according to claim 12, wherein the step of adjusting the present reference current to the adjusted reference current according to the difference between the read data and the expected data comprises:

adjusting a value of the present reference current, and defining the present reference current as a first reference current when the number of "1" of the read data is different from the number of "1" of the expected data;

taking a reference current higher than the first reference current as the adjusted reference current, wherein the reference current makes the memory cells have a sufficient operation window; and recording the difference and the adjusted reference current in the look-up table.

19. The method according to claim 12, wherein the step of adjusting the present reference current to the adjusted reference current according to the difference between the read data and the expected data comprises:

adjusting a value of the present reference current, defining the present reference current as a first reference current when the number of "1" of the read data is one half of the number of "1" of the expected data, and defining the present reference current as a second reference current when the number of "0" of the read data is one half of the number of "0" of the expected data;

averaging the first reference current and the second reference current to get the adjusted reference current; and recording the difference and the adjusted reference current in the look-up table.

* * * * *